(12) United States Patent
Pancera et al.

(10) Patent No.: US 10,396,423 B2
(45) Date of Patent: Aug. 27, 2019

(54) DEVICE INCLUDING A PASSAGE WITHIN A NON-CONDUCTIVE CARRIER, WHEREIN THE PASSAGE TRANSMITS A HIGH-FREQUENCY SIGNAL BETWEEN A TRANSMITTER AND A RECEIVER WHICH ARE GALVANICALLY ISOLATED FROM EACH OTHER

(71) Applicant: Robert Bosch GmbH, Stuttgart (DE)

(72) Inventors: Elena Pancera, Leonberg (DE); Juergen Hasch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/546,810

(22) PCT Filed: Jan. 15, 2016

(86) PCT No.: PCT/EP2016/050779
§ 371 (c)(1),
(2) Date: Jul. 27, 2017

(87) PCT Pub. No.: WO2016/131572
PCT Pub. Date: Aug. 25, 2016

(65) Prior Publication Data
US 2018/0019511 A1    Jan. 18, 2018

(30) Foreign Application Priority Data
Feb. 18, 2015    (DE) .................. 10 2015 202 872

(51) Int. Cl.
*H01P 5/08*    (2006.01)
*H01P 5/02*    (2006.01)
(Continued)

(52) U.S. Cl.
CPC ............... *H01P 5/08* (2013.01); *H01P 5/028* (2013.01); *H05K 1/0239* (2013.01); *H05K 1/141* (2013.01);
(Continued)

(58) Field of Classification Search
CPC .......... H01P 1/042; H01P 3/121; H01P 5/024; H01P 5/08
(Continued)

(56) References Cited

U.S. PATENT DOCUMENTS

| 6,545,572 B1 | 4/2003 | Ohta et al. |
| 2006/0033671 A1* | 2/2006 | Chan et al. .......... H01Q 13/106 343/769 |

(Continued)

FOREIGN PATENT DOCUMENTS

| DE | 19951123 A1 | 2/2001 |
| DE | 10104864 A1 | 8/2002 |

(Continued)

OTHER PUBLICATIONS

International Search Report dated Apr. 19, 2016, of the corresponding International Application PCT/EP2016/050779 filed Jan. 15, 2016.

*Primary Examiner* — Benny T Lee
(74) *Attorney, Agent, or Firm* — Norton Rose Fulbright US LLP; Gerard Messina (57) ABSTRACT

A device and a method for transmitting a high-frequency signal. The device is designed to include a carrier, through which a passage is formed; a transmitting element on a first surface of the carrier, to which the high-frequency signal may be applied; and a receiving element on a second surface of the carrier, which is galvanically isolated from the transmitting element, the high-frequency signal being transmit- (Continued)

table as an electromagnetic wave through the passage to the receiving element with the aid of the transmitting element.

15 Claims, 6 Drawing Sheets

(51) Int. Cl.
  *H05K 1/02* (2006.01)
  *H05K 1/14* (2006.01)
(52) U.S. Cl.
  CPC .............. *H05K 2201/09072* (2013.01); *H05K 2201/10098* (2013.01); *H05K 2201/10545* (2013.01)
(58) Field of Classification Search
  USPC ........................................................ 333/24 R
  See application file for complete search history.

(56) References Cited

U.S. PATENT DOCUMENTS

| | | |
|---|---|---|
| 2008/0297283 A1 | 12/2008 | Byun et al. |
| 2011/0050534 A1 | 3/2011 | Shimayama et al. |
| 2012/0256707 A1* | 10/2012 | Leiba et al. ............ H01P 3/003 333/208 |
| 2013/0278349 A1 | 10/2013 | Dayan et al. |
| 2016/0064792 A1* | 3/2016 | Qiang et al. ............ G01S 13/02 342/175 |

FOREIGN PATENT DOCUMENTS

| | | |
|---|---|---|
| JP | 2002164465 A | 6/2002 |
| JP | 2008252207 A | 10/2008 |
| JP | 2014190720 A | 10/2014 |
| WO | 2011030277 A2 | 3/2011 |

\* cited by examiner

DEVICE INCLUDING A PASSAGE WITHIN A NON-CONDUCTIVE CARRIER, WHEREIN THE PASSAGE TRANSMITS A HIGH-FREQUENCY SIGNAL BETWEEN A TRANSMITTER AND A RECEIVER WHICH ARE GALVANICALLY ISOLATED FROM EACH OTHER

FIELD

The present invention relates to a device and to a method for transmitting a high-frequency signal.

BACKGROUND INFORMATION

High-frequency signals, in the form of electromagnetic waves, are frequently emitted by antenna units which are formed on circuit boards and include antenna elements, such as microstrip antennas. Usually, a preferably large surface area of the antenna unit, relative to the surface area of the circuit board, is desirable to optimally utilize the space taken up by the circuit board.

Conventionally, means for generating the high-frequency signal and the antenna unit including the antenna elements are formed on the same surface of a carrier or of a circuit board. This, however, takes up space on the surface of the carrier or of the circuit board which could also be used to form an antenna unit having a larger surface area. Furthermore, interference signals, which may impair the quality of the high-frequency signal to be emitted, may originate from the means for generating the high-frequency signal and the galvanic connections to the antenna elements.

German Patent Application No. DE 101 04 864 A1 describes a device for sending and/or receiving radar beams, which includes a circuit board having one antenna situated on one side, and electric circuits situated on the other side. Via a feed network designed in coplanar line technology, the at least one antenna is galvanically connected to the electric circuits.

SUMMARY

In accordance with the present invention, an example device is provided which is designed to include: an electrically non-conductive carrier, which in particular may also be designed as a multilayer structure, the individual layers possibly being partially conductive, through which a passage is formed from a first surface of the carrier to a second surface of the carrier; a transmitting element, which is situated on or at the first surface of the carrier and to which the high-frequency signal may be applied; and a receiving element, which is situated on or at the second surface of the carrier and which is galvanically isolated from the transmitting element, the applied high-frequency signal being transmittable through the passage of the carrier as an electromagnetic wave to the receiving element with the aid of the transmitting element.

The electrically non-conductive carrier may also be designed as a multilayer structure from a plurality of individual layers, one or multiple of the individual layers possibly being (partially) electrically conductive (e.g., ground, wired lines and the like). The carrier may also be implemented as a single-layer structure.

Furthermore, an example method is provided, including the steps: providing a high-frequency signal; transmitting the high-frequency signal via a galvanic connection to a transmitting element, which is formed at or on a first surface of an electrically non-conductive carrier; and transmitting the high-frequency signal through a passage, which is formed from the first surface of the carrier, to a second surface of the carrier as an electromagnetic wave to a receiving element, which is formed at or on the second surface of the carrier.

The example device according to the present invention allows a high-frequency signal to be transmitted through a carrier, losses and undesirable interference signals being reduced or avoided, and a space-saving design being made possible. The device may be used in a radar system, for example.

The transmitting element and/or the receiving element may be designed, for example, as a microstrip patch, as a coplanar waveguide patch, as an aperture-coupled patch, or as a dipole or slot dipole or another slot element.

The passage acts as a cavity, for example, and may be metallized, for example. The dimensions of the passage constitute a lower cutoff for the frequencies of the high-frequency signal. The passage may be cylindrical and be produced, for example, by an etching process. The cylindrical passage is advantageously designed with a diameter between two and ten millimeters, preferably between three and six and a half millimeters, for example to transmit a high-frequency signal at 77 Gigahertz. Advantageously, a high-frequency signal may be transmitted at a frequency of at least twenty Gigahertz. A bandwidth of the transmission with the aid of the device according to the present invention is influenced by features of the transmitting element and the receiving element.

Advantageous specific embodiments and refinements are described herein with reference to the figures.

According to one specific embodiment, the transmitting element is situated between the carrier and a first reflector element, which reflects electromagnetic waves incident from the direction of the passage in the direction of the passage. According to one further specific embodiment, the receiving element is situated between the carrier and a second reflector element, which reflects electromagnetic waves incident from the direction of the passage in the direction of the passage.

According to one further specific embodiment, the device includes a first closure element, which is situated at the first surface of the carrier over the passage and which includes a first metallic layer facing the passage. According to one further specific embodiment, the device includes a second closure element, which is situated at the second surface of the carrier over the passage and which includes a second metallic layer facing the passage. The first and second closure elements may advantageously be designed mirror-symmetrically with respect to a plane of mirror symmetry. The closure elements may form a further integral part of the cavity defined by the passage.

According to one specific embodiment, the first reflector element is designed as a third metallic layer provided at a surface of the first closure element facing away from the carrier. According to one specific embodiment, the second reflector element is designed as a fourth metallic layer provided at a surface of the second closure element facing away from the carrier. In this way, a particularly high reflectivity for the electromagnetic waves, for example of more than 50%, preferably of more than 75%, particularly preferably of more than 90%, most particularly preferably of more than 99% is achievable by the reflector element or elements.

If a first element is to be formed "on" a surface of a second element, this shall be understood to mean both that the first element is formed directly at the second element at the surface, and that the first element is formed indirectly over this surface. If the first element is to be formed "at" the surface of the second element, this shall be understood to mean that the first element is formed directly at the surface. If the first element is to be situated in a certain manner with respect to a second element, this shall not necessarily be intended to mean that the second element must already be formed when the first element is being formed.

Rather, a final state is described here, which those skilled in the art may implement according to the description.

The closure elements could advantageously be bonded to the carrier with the aid of ball bonds. Preferably, the closure elements are designed as circuit boards or as integrated circuits. For mechanical reinforcement of the closure elements, these closure elements may include an additional carrier, e.g., made of an FR4 material. FR4 or FR-4 ("flame retardant") denotes a class of flame-resistant and flame-retarding composite materials made up of epoxy resin and glass fiber fabric. In the present invention, an FR4 material may be used as electrically non-conductive carrier material in electrical circuit boards.

The closure elements may also be soldered to the carrier, the closure elements being produced in the form of quad flat no-lead (QFN) packages and as micro lead frame (MLF) packages. Using a packaging technique for integrated circuits, the closure elements may also be produced by structuring metallic layers on surfaces of a mold material, or as embedded wafer level ball grid arrays (eWLB).

According to one specific embodiment, the transmitting element is designed as a first section of the first metallic layer. According to one specific embodiment, the receiving element is designed as a first section of the second metallic layer. Advantageously, the transmitting element and/or the receiving element is/are designed as microstrip antennas.

According to one specific embodiment, a first non-conductive layer, which seals the passage at the first surface, is formed at the first surface of the carrier. According to one specific embodiment, a second non-conductive layer, which seals the passage at the second surface, is formed at the second surface of the carrier.

According to one specific embodiment, the transmitting element is situated at the first non-conductive layer, preferably at a surface of the first non-conductive layer facing away from the passage. According to one specific embodiment, the receiving element is situated at the second non-conductive layer, preferably at a surface of the second non-conductive layer facing away from the passage.

According to one specific embodiment, the device includes at least one antenna element, which is situated at or on the second surface of the carrier and which is galvanically or electromagnetically connected to the receiving element for transmitting the high-frequency signal from the receiving element to the antenna element. In this way, an antenna device, which in particular includes at least one antenna element, may be formed across a large surface area at or on the second surface of the carrier, while the high-frequency signal for operating the at least one transmitting antenna may be generated or applied in a space-saving manner at or on the second surface of the carrier. In this way, the surface of the carrier usable for the antenna elements is maximized.

According to one specific embodiment, the device includes a high-frequency signal generation unit for generating the high-frequency signal, which is situated at or on the first surface of the carrier. The high-frequency signal generation unit is, in particular, galvanically connected to the transmitting element for transmitting the high-frequency signal from the high-frequency signal generation unit to the transmitting element. A location where the high-frequency signal is generated is thus formed at the first surface of the carrier, while the high-frequency signal can be drawn from at the second surface of the carrier, whereby a particularly large portion of the second surface may be provided with utility structures, such as antenna elements, for example.

According to one specific embodiment, the method furthermore includes the steps: transmitting the high-frequency signal transmitted to the receiving element via a galvanic connection to at least one transmitting antenna; and emitting an electromagnetic wave by the at least one antenna element, based on the high-frequency signal transmitted to the at least one antenna element.

BRIEF DESCRIPTION OF THE DRAWINGS

The present invention is described in greater detail hereafter based on the exemplary embodiments shown in the figures.

In all figures, identical or functionally equivalent elements and devices were denoted by the same reference numerals, unless indicated otherwise.

DETAILED DESCRIPTION OF EXAMPLE EMBODIMENTS

Figure 1:
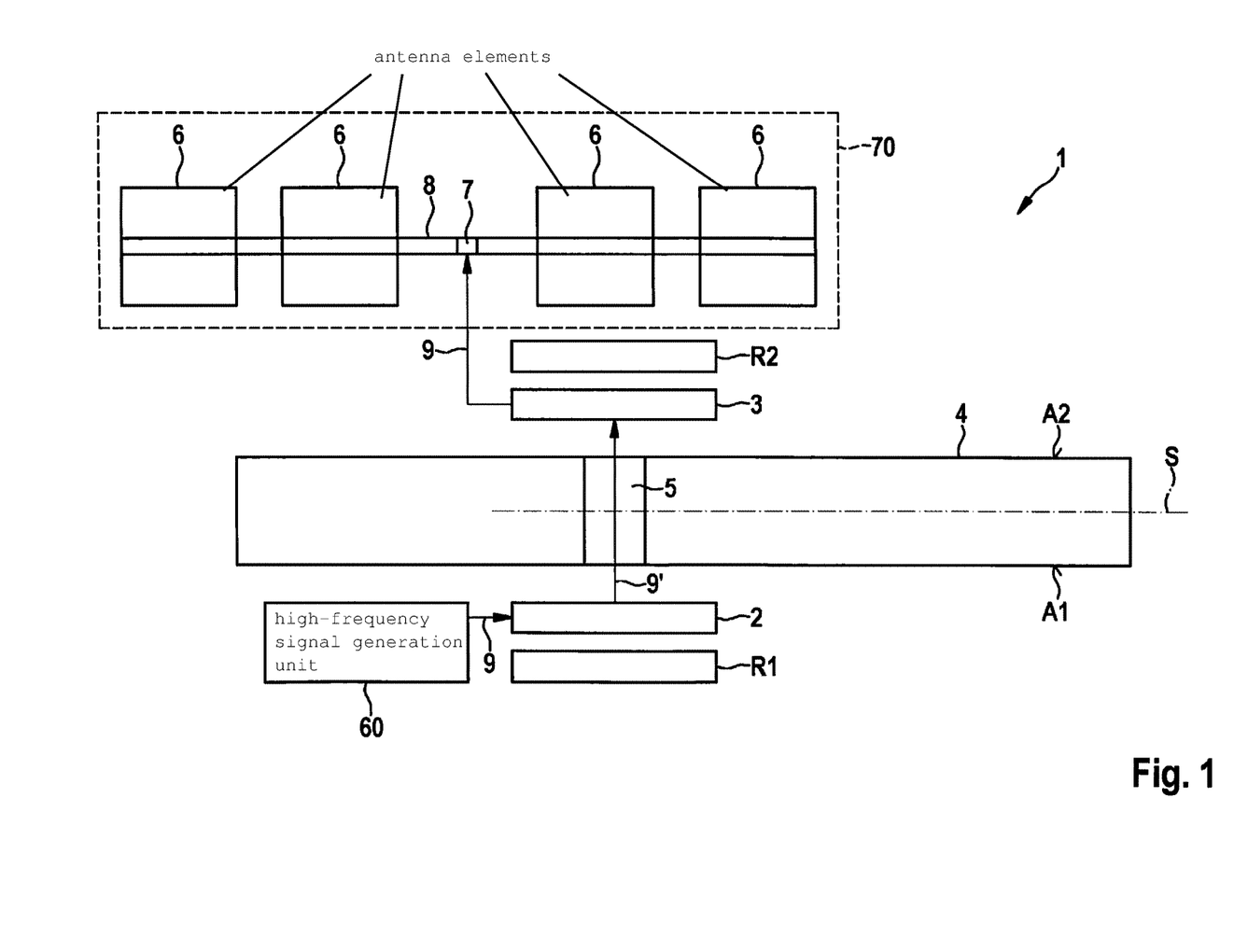
FIG. 1 shows a schematic block diagram to explain a device for transmitting a high-frequency signal according to a first specific embodiment of the present invention.

FIG. 1 shows a schematic block diagram to explain a device 1 for transmitting a high-frequency signal 9 according to a first specific embodiment of the present invention.

Device 1 includes a carrier 4, through which a passage 5 is formed from a first surface A1 of carrier 4 to a second surface A2 of the carrier. First surface A1 is parallel to second surface A2 and faces away from second surface A2.

An optional high-frequency signal generation unit 60 is situated on or at first surface A1. A high-frequency signal 9 may be generated with the aid of high-frequency signal generation unit 60. High-frequency signal generation unit 60 is electromagnetically and/or electrically, e.g., via a galvanic connection, connected to a transmitting element 2, which is situated at or on first surface A1 of carrier 4 in the area of passage 5. In particular, a geometric projection of transmitting element 2 onto first surface A1 completely covers the opening of passage 5 in first surface A1.

A receiving element 3 is situated in the area of passage 5 at or on second surface A2. In particular, a geometric projection of receiving element 3 onto second surface A2 completely covers the opening of passage 5 in second surface A2. Transmitting element 2 and receiving element 3 are galvanically isolated from one another.

Transmitting element 2 is situated between carrier 4 and an optional first reflector element R1, which reflects electromagnetic waves incident from the direction of passage 5 in the direction of passage 5. In some specific embodiments, first reflector element R1 may be dispensed with. Receiving element 3 is optionally situated between carrier 4 and an optional second reflector element R2, which is suitable for reflecting electromagnetic waves incident from the direction of passage 5 in the direction of passage 5. In some specific embodiments, second reflector element R2 may be dispensed with. Preferably, transmitting element 2 and receiving element 3 are situated mirror-symmetrically to one another with respect to a plane of symmetry S, which is parallel to surfaces A1, A2 of carrier 4 and preferably half way between first and second surfaces A1, A2. Moreover, first and second reflector elements R1, R2 are preferably also mirror-symmetrical to one another with respect to plane of symmetry S.

High-frequency signal 9 transmitted via the galvanic connection from high-frequency signal generation unit 60 to transmitting element 2 is transmittable via passage 5 as electromagnetic wave 9' to receiving element 3 with the aid of transmitting element 2. Passage 5 through carrier 4 may be open toward the outside, i.e., on an outer side of device 1. Passage 5, however, may also be closed on one side or both sides. If passage 5 is closed on both sides, it may be filled with a gas or gas mixture, for example, or enclose a—technically producible—vacuum.

Optionally, device 1 includes an antenna unit 70, which is situated on or at second surface A2 of carrier 4. Antenna unit 70 includes one or multiple antenna elements 6, four antenna elements 6 being shown by way of example in FIG. 1, which are designed in microstrip technology, for example, and are electromagnetically and/or electrically, e.g., galvanically, connected to a feed point 7 with the aid of a line 8, e.g., a microstrip line. Feed point 7 is electromagnetically and/or electrically, e.g., galvanically, connected to transmitting element 3 in such a way that high-frequency signal 9 received as electromagnetic wave 9' at transmitting element 3 is transmittable to feed point 7, and thus to antenna unit 70. Antenna unit 70 is operable with the aid of transmitted high-frequency signal 9. Preferably, feed point 7 is situated on the center of line 8, so that supply paths for high-frequency signal 9 from feed point 7 to antenna elements 6 are minimized.

High-frequency signal 9 may, for example, also be transmittable from an external high-frequency signal generation unit via a galvanic connection to transmitting element 2. Instead of being irradiated by antenna unit 70, the high-frequency signal may also be tapped at feed point 7, e.g., for exciting additional lines.

Figure 2:
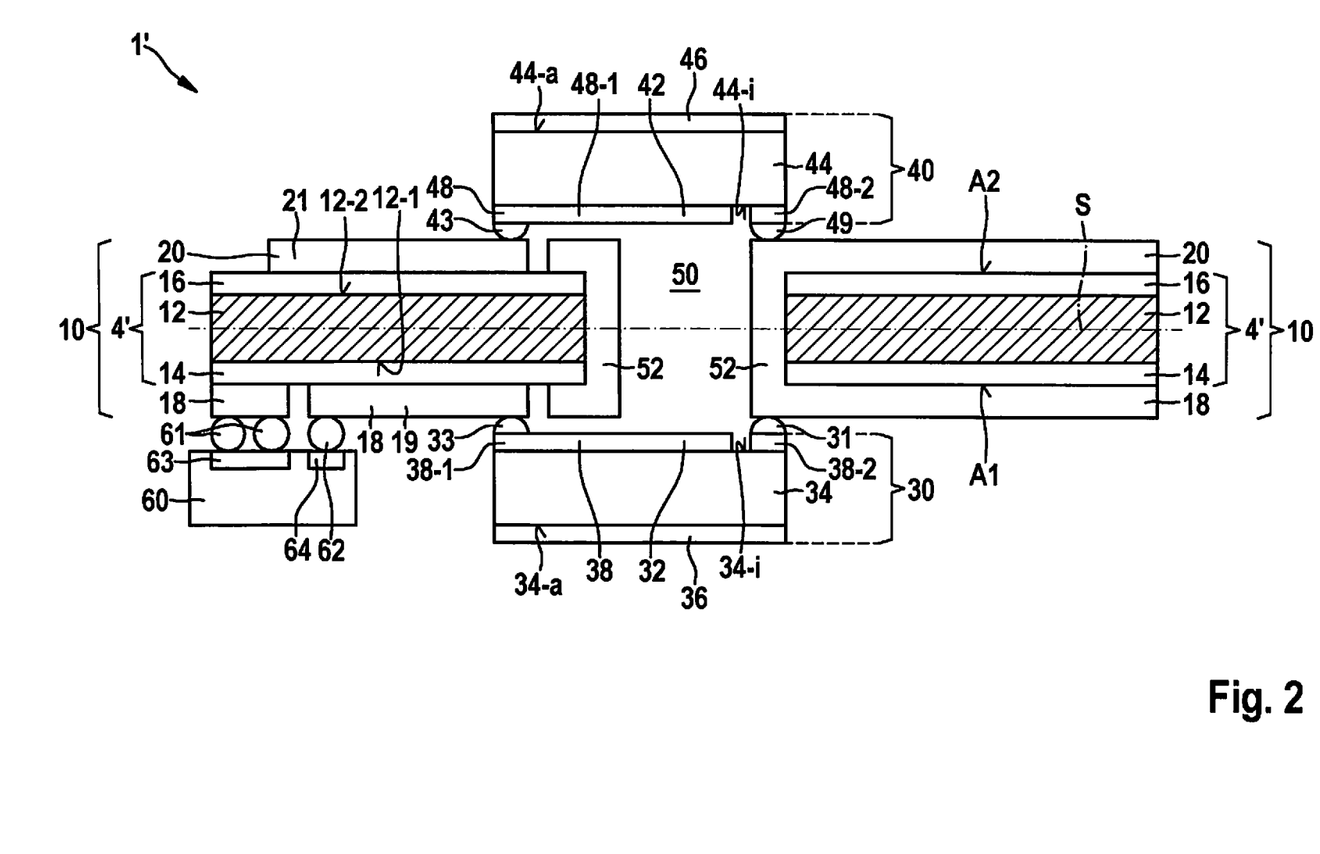
FIG. 2 shows a schematic block diagram to explain a device for transmitting a high-frequency signal according to a second specific embodiment of the present invention.

FIG. 2 shows a schematic representation of a device 1' for transmitting a high-frequency signal. Carrier 4' of device 1' includes a center layer 12, which is formed of an FR4 material, for example. This center layer 12 may also be a multilayer structure having partially conductive and non-conductive individual layers. Center layer 12 acts as ground and/or is grounded, or one or multiple of the individual layers of the multilayer structure may be grounded.

A first electrically non-conductive layer 14 is formed at a first surface 12-1 of center layer 12, and a second electrically non-conductive layer 16 is formed at a second surface 12-2 of center layer 12, which faces away from first surface 12-1 of center layer 12 and is situated in parallel thereto. First and second electrically non-conductive layers 14, 16 are formed, for example, of a high-frequency material (RF substrate), such as Teflon or a ceramic or a liquid crystal polymer (LCP).

The layer structure, made up of center layer 12 and first and second electrically non-conductive layers 14, 16 sandwiching center layer 12 between themselves, corresponds to a carrier 4' according to the second specific embodiment of the present invention. A first structured conductive layer 18 is formed at first surface A1 of carrier 4', which is situated over first surface 12-1 of center layer 12. A second structured conductive layer 20 is formed at second surface A2 of carrier 4', which is situated over second surface 12-2 of center layer 12. Carrier 4', together with first and second structured electrically conductive layers 18, 20, forms a circuit board 10.

A passage 50, which is covered neither at first outer surface A1 by first electrically conductive layer 18, nor at second surface A2 by second electrically conductive layer 20, extends through carrier 4', from first surface A1 to second surface A2. Passage 50 is metallized at its walls inside carrier 4' with the aid of a metallization 52, depending on the desired application a connection being establishable between parts or insulated sections of first electrically conductive layer 18 and parts, in particular, between otherwise electrically insulated sections of second electrically conductive layer 20.

High-frequency signal generation unit 60 is bonded to first electrically conductive layer 18 via a first electromagnetic connection 61, according to the second specific embodiment in the form of ball bonds here. Control signals, for example, are transmittable via first electromagnetic connection 61 to a signal input unit 63 of high-frequency signal generation unit 60, based on which high-frequency signal generation unit 60 generates high-frequency signal 9 (FIG. 1). Via at least one second electromagnetic and/or electrical connection 62 (shown here in the form of ball bonds), which is electromagnetically and/or galvanically connected to a signal output unit 64 of high-frequency signal generation unit 60, high-frequency signal generation unit 60 is galvanically connected via a first section 19 of first electrically conductive layer 18 to transmitting element 32. For this purpose, a first galvanic connection 33, according to the second specific embodiment as a ball bond, may be formed electrically between first section 19 of first electrically conductive layer 18 and transmitting element 32. In this way, high-frequency signals generatable by high-frequency signal generation unit 60 are outputtable at signal output unit 64 and transmittable to transmitting element 32.

Via first galvanic connection 33 and via a second galvanic connection 31, designed according to the second specific embodiment by a ball bond and illustrated, a first closure element 30 is mechanically connected to carrier 4' in the area of passage 50. Due to second galvanic connection 31, first closure element 30 is electrically connected to a section of first electrically conductive layer 18 which is galvanically isolated from first section 19, in particular to ground.

Figure 3:
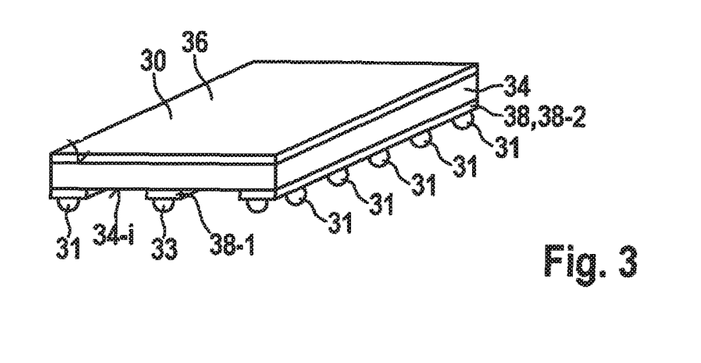
FIGS. 3 through 5 schematically show details of the first closure element according to the second specific embodiment of the present invention.
Figure 4:
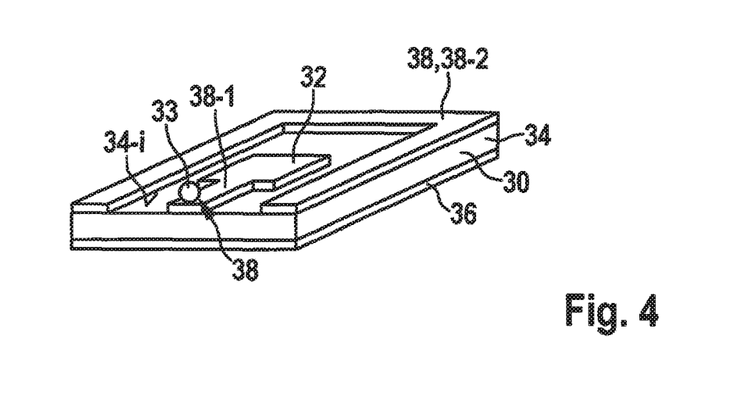
Figure 5:
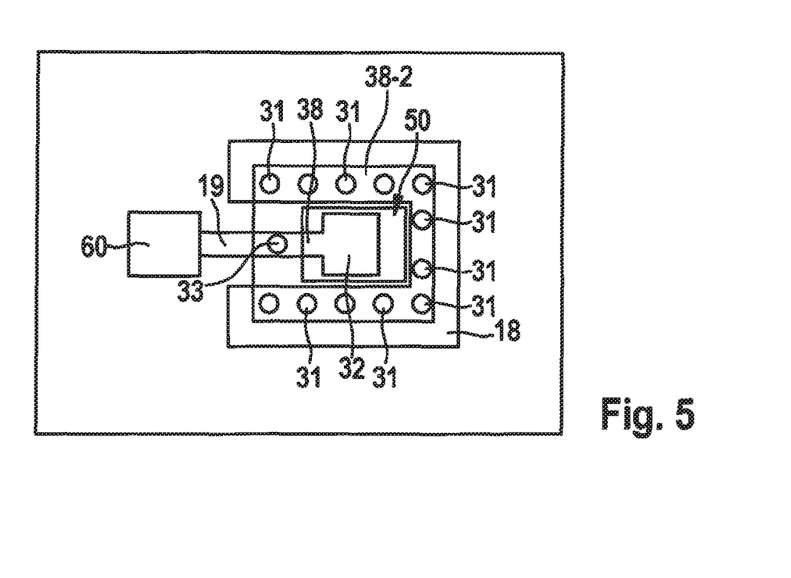

At a first surface 34-i of a non-conductive carrier 34 of first closure element 30, which for the sake of clarity is referred to hereafter as second carrier 34, a first structured metallic layer 38 is formed (see details in FIGS. 3 through 5). First surface 34-i faces carrier 4' and passage 50. First structured metallic layer 38 includes two sections 38-1, 38-2 galvanically isolated from one another. First section 38-1 of first structured metallic layer 38 is galvanically connected to first galvanic connection 33. Second galvanic connection 31, which in FIGS. 4 and 5 is shown as twelve ball bonds by way of example, represents a mechanical and grounding connection between carrier 4', in particular, to first electrically conductive layer 18 and non-conductive second carrier 34 of first closure element 30.

First closure element 30 corresponds to transmitting element 3 and reflector element R1 according to the first specific embodiment, and is shown in greater detail from various views in FIGS. 3 through 5.

FIG. 3 shows the first closure element 30 separately from a first oblique view for illustration purposes. A third metallic layer 36 is formed as a first reflector element across the full surface area of a second surface 34-a (FIG. 2) of second carrier 34 of first closure element 30 which faces away from first surface 34-i of second carrier 34 of first closure element 30. Third metallic layer 36 is used, in particular, to reflect electromagnetic waves which are emitted with the aid of transmitting element 32 (FIG. 2) through second carrier 34 in a direction pointing away from carrier 4'(FIG. 2). In this way, it is possible to avoid a loss of power and/or interference signals for equipment situated outside device 1'(FIG. 2) from arising. To further reduce undesirable electromagnetic radiation, contactings (e.g., vias, microvias or through-mold vias (TMV)) optionally may galvanically connect second section 38-2 of first metallic layer 38 to third metallic layer 36 through the material of second carrier 34 (not shown in FIGS. 3 through 5).

FIG. 4 shows a second schematic oblique view of first closure element 30, in which first surface 34-i of second carrier 34 facing carrier 4' and first metallic layer 38 are visible. Second galvanic connection 31 in the form of the ball bonds is not shown. Second section 38-2 of first metallic layer 38 is situated, for example vapor-deposited, along three edges of the rectangularly shaped first closure element 30 directly at first surface 34-i of second carrier 34. First galvanic connection 33 is situated at the fourth edge of first closure element 30. Second section 38-2 may also be partially situated at the fourth edge, the second section being galvanically isolated from first galvanic connection 33 and first section 38-1. FIGS. 3 through 5 show first closure element 30, for example, in a rectangular shape; however, it may also take on other shapes, such as round shapes.

First section 38-1 widens toward the geometric center of the square shape of first closure element 30 to form first transmitting element 32. First transmitting element 32 may be implemented as a microstrip antenna, for example, as shown in FIGS. 4 and 5, but also, e.g., as a coplanar waveguide (CPW) or slot element. Depending on which technology is used for first transmitting element 32, third metallic layer 36 may or may not be optionally provided. First transmitting element 32 is shown in a square shape in FIGS. 4 and 5, for example, but may also have other shapes (e.g., rectangular with rounded edges, round, diamond shape and the like), and its position on first surface 34-i may deviate from the geometric center of first surface 34-i of second carrier 34. Second carrier 34 may include a circuit board material (such as FR4, ceramic and the like), but may also include mold material or glass, or be made thereof. The second carrier may also be a multilayer structure.

FIG. 5 shows a schematic top view onto device 1' and onto first surface A1 (FIG. 2), first closure element 30 (FIGS. 3 and 4) being shown partially transparent. It is apparent from FIG. 5 that first transmitting element 32 has a rectangular shape, a first geometric projection of first transmitting element 32 onto first surface A1 being covered by a second geometric projection of passage 50 onto first surface A1 and by the opening of passage 50 in first surface A1. The first geometric projection may be covered completely or also only partially, i.e., a surface area of first transmitting element 32 may be larger or smaller than a cross section of passage 50. The geometric center of transmitting element 32 may deviate from the geometric center of passage 50.

Returning to FIG. 2, second closure element 40, which represents a mirror image of first closure element 30 with respect to a plane of symmetry S situated in parallel to surfaces A1, A2 of carrier 4' and between first and second surfaces A1, A2, is situated on second surface A2 of carrier 4'. Second closure element 40 thus includes a third electrically non-conductive carrier 44 having a first surface 44-i of third carrier 44, which faces carrier 4', and on which, once again, a second metallic layer 48 is provided. Second metallic layer 48 is made up of a first section 48-1, which via a third galvanic connection 43 (e.g., via a ball bond) is galvanically connected to a first section 21 of second electrically conductive layer 20. In this way, high-frequency signal 9 (FIG. 1) can be drawn from at first section 21 of second electrically conductive layer 20, for example for feeding into feed point 7 of antenna unit 70, as shown in FIG. 1.

Second metallic layer 48 furthermore includes a second section 48-2, which represents a mirror image of second section 38-2 of first metallic layer 38 with respect to plane of symmetry S and which thus is also galvanically isolated from first section 48-1 of second metallic layer 48. Via a fourth galvanic connection 49 (e.g., ball bonds), second section 48-2, for example for grounding, is galvanically connected to second electrically conductive layer 20.

First section 48-1 of second metallic layer 48 is designed laterally reversed with respect to plane of symmetry S in relation to first section 38-1 of first metallic layer, so that first section 48-1 widens toward the geometric center of the rectangular shape of second closure element 40 to form a receiving element 42 designed as a microstrip antenna. As described for first closure element 30, aside from a square shape of receiving element 42, second closure element 40 may also have other shapes, such as round shapes, and receiving element 42 may deviate from a geometric center of first surface 44-i of third carrier 44, as described above.

At a second surface 44-a of third carrier 44, a fourth metallic layer 46, which completely covers second surface 44-a of third carrier 44, is formed laterally reversed to third metallic layer 36, with respect to plane of symmetry S. Fourth metallic layer 46 serves as a second reflector element for reflecting electromagnetic waves from the direction of passage 50 in the direction of passage 50, and thus also in the direction of receiving element 42. To further reduce undesirable electromagnetic radiation, contactings (e.g., vias, through-mold vias (TMV) and the like) may optionally connect second section 48-2 of second metallic layer 48 galvanically to fourth metallic layer 46 through the material of third carrier 44 (contactings and vias not shown). The options described for first closure element 30 with respect to the production technologies of transmitting element 32 also apply analogously to receiving element 42. Like second carrier 34, third carrier 44 may include a circuit board material (such as FR4, ceramic and the like), but may also include mold material or glass, or be made thereof, and may also be designed as a multilayer structure.

Figure 6:
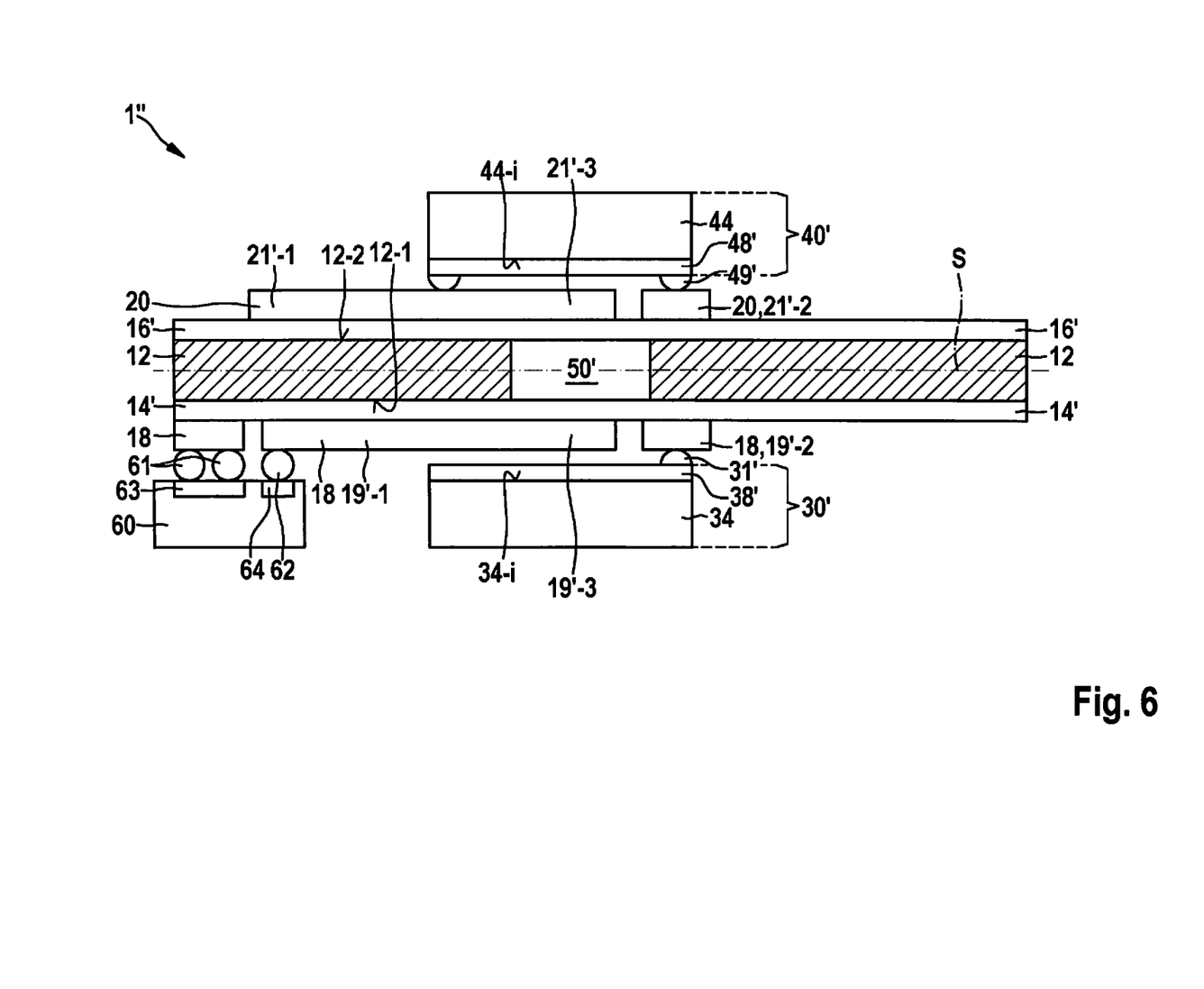
FIG. 6 shows a schematic block diagram to explain a device for transmitting a high-frequency signal according to a third specific embodiment of the present invention.

FIG. 6 shows a schematic cross-sectional view through a device 1" according to a third specific embodiment of the present invention.

Device 1" is a variant of device 1', the differences being described in greater detail hereafter.

In device 1", a center layer 12 is joined at a first surface 12-1 to a first non-conductive layer 14', which is produced from a high-frequency material, for example. A second non-conductive layer 16' is situated at a second surface 12-2 of center layer 12 and is formed of high-frequency materials, for example, preferably of the same materials as first non-conductive layer 14'. Center layer 12 may also be a multi-layer structure. On device 1", passage 50' is formed from first surface 12-1 to second surface 12-2 of center layer 12, second surface 12-2 of center layer 12 being parallel to first surface 12-1 and facing away therefrom. In contrast to the second specific embodiment, however, both first non-conductive layer 14' on first surface 12-1 and second non-conductive layer 16' on second surface 12-2 of center layer 12 completely cover passage 50' so that passage 50' does not include an access to the outer side of device 1", i.e., passage 50' may be referred to as a cavity. On device 1", center layer 12 is referred to as the carrier.

On device 1", a first section 19'-1 of first metallic layer 18 situated at first non-conductive layer 14' widens in the area of passage 50' to form a transmitting element 19'-3 (for example, designed as a microstrip antenna, but also a CPW antenna or an antenna according to another technology). First antenna 19'-3 is designed in such a way that first geometric projection of first antenna 19'-3 onto first surface 12-1 is covered by the second geometric projection of passage 50' onto first surface 12-1. The first geometric projection may be covered completely or also only partially, i.e., a surface area of first antenna 19'-3 may be larger or smaller than a cross section of passage 50'. The geometric center of transmitting element 19'-3 may deviate from the geometric center of passage 50'.

As is also the case in device 1', in device 1" a first metallic layer 38', which serves as the first reflector element, is formed across the full surface area, i.e., completely, on a first surface 34-*i* of second carrier 34 facing center layer 12. First metallic layer 38' is bonded to a second section 19'-2 of first electrically conductive layer 18 via a galvanic connection 31' (e.g., ball bonds) for grounding.

Figure 7:
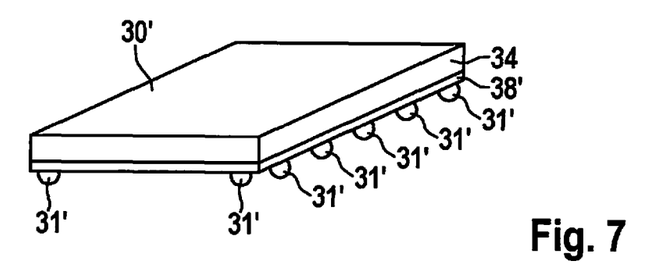
FIGS. 7 through 9 schematically show details of the first closure element according to the third specific embodiment of the present invention.
Figure 8:
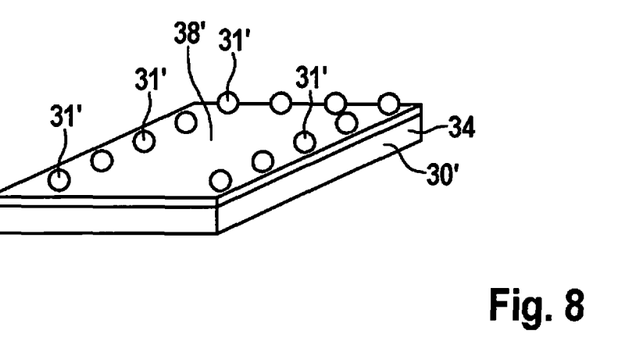
Figure 9:
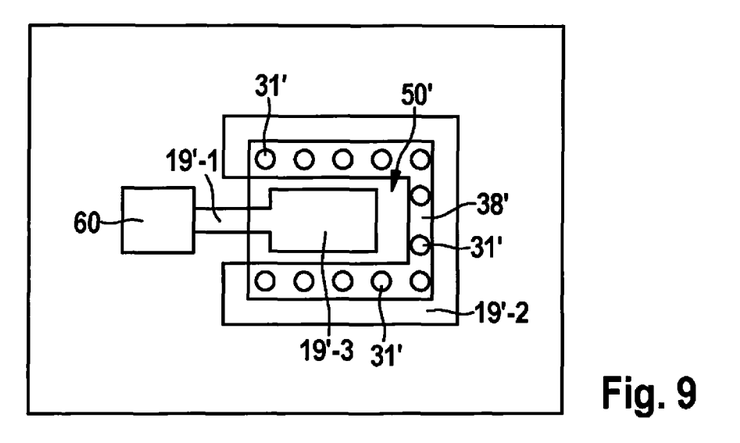

Second section 19'-2 is galvanically isolated from first section 19'-1 of first electrically conductive layer 18. The ball bonds of galvanic connection 31' are not shown in FIG. 6 for the sake of clarity, but are shown in FIGS. 7 through 9 (twelve ball bonds are shown by way of example here). It is apparent that galvanic connection 31' galvanically connects first metallic layer 38' to that section of first electrically conductive layer 18 which is galvanically isolated from transmitting element 19'-3.

A first section 21'-1 of second electrically conductive layer 20, which widens in the area of passage 50' to form a receiving element 21'-3 (e.g., in the form of a microstrip antenna, CPW antenna, and the like), is, in turn, formed on second surface 12-2 of center layer 12, in particular on second non-conductive layer 16'. Transmitting element 19'-3 and receiving element 21'-3 are mirror images according to plane of mirror symmetry S, which is situated between first and second surfaces 12-1, 12-2 of center layer 12 and in parallel thereto. High-frequency signal 9 (FIG. 1) can be drawn from first section 21'-1. According to specific embodiment 1", the path of high-frequency signal 9 is as follows:

Generated by high-frequency signal generation unit 60, high-frequency signal 9 is transmitted via first section 19'-1 of first electrically conductive layer 18 to transmitting element 19'-3. For example, high-frequency signal 9 is output at signal output unit 64 of high-frequency signal generation unit 60 and transmitted via second ball bond 62 and via first section 19'-1 of first electrically conductive layer 18 to transmitting element 19'-3. Transmitting element 19'-3 designed as a first microstrip antenna is induced by high-frequency signal 9 (FIG. 1) to emit electromagnetic waves 9', which are transmitted through first non-conductive layer 14' in the area of passage 50', through passage 50', and through second non-conductive layer 16' in the area of passage 50' to receiving element 21'-3 designed as a second microstrip antenna. First and second microstrip antennas may be referred to as capacitively coupled. High-frequency signal 9 received at receiving element 21'-3 is then transmitted to first section 21'-1 of second electrically conductive layer 20 via a galvanic connection and can be drawn from there, for example for an antenna unit 70 (FIG. 1), as was described with respect to first specific embodiment.

In device 1" as well, second closure element 40' is designed laterally reversed to first closure element 30' with respect to plane of mirror symmetry S, so that second metallic layer 48' also covers first surface 44' of second closure element 40' facing passage 50' across the full surface area, i.e., completely, and thus acts as a second reflector element for electromagnetic waves impinging from the direction of passage 50'. Via a sixth connection 49' (e.g., ball bonds), second metallic layer 48', for example for grounding, is galvanically connected to a second section 21'-2 of second electrically conductive layer 20, which is galvanically isolated from first section 21'-1 of second electrically conductive layer 20. Closure elements 30', 40' are schematically illustrated in FIGS. 7 through 9. In FIGS. 7-9, closure elements 30', 40' are shown in rectangular shapes; however, these may also be designed in different geometric shapes (e.g., may be round).

Transmitting element 19'-3 is shown in a rectangular shape in FIG. 9, for example. Transmitting element 19'-3 may also be designed in other geometric shapes (round, rectangular with rounded edges, in rhombic shape and the like) and manufactured with the aid of different technologies (microstrips, CPW and the like). FIG. 8 and FIG. 9 show the galvanic connection as twelve ball bonds. It is also possible to use more or fewer ball bonds or other bonding methods.

First and second closure elements 30', 40' may be designed as metallized second and third carriers 34, 44 from any arbitrary planar material, e.g., from a FR4 material. Alternatively, however, first and second closure elements 30', 40' may also be designed only from a simple small metal plate in each case, for example as a reflector element, entirely without second and third carriers 34, 44. First closure element 30' may also be designed with second carrier 34, and second closure element 40' may be designed without third carrier 44, or vice versa. Third and/or fourth metallic layers 36, 46 in device 1' may also be omitted in device 1".

A difference between device 1' and device 1" is that, in device 1', transmitting element 32 is situated on closure element 30, and receiving element 42 is situated on closure element 40, while in device 1" transmitting element 19'-3 is not situated on closure element 30', but on first electrically non-conductive layer 14' separately from first closure element 30', and receiving element 21'-3 is not situated on closure element 40', but on second electrically non-conductive layer 16' separately from second closure element 40'.

Figure 10:
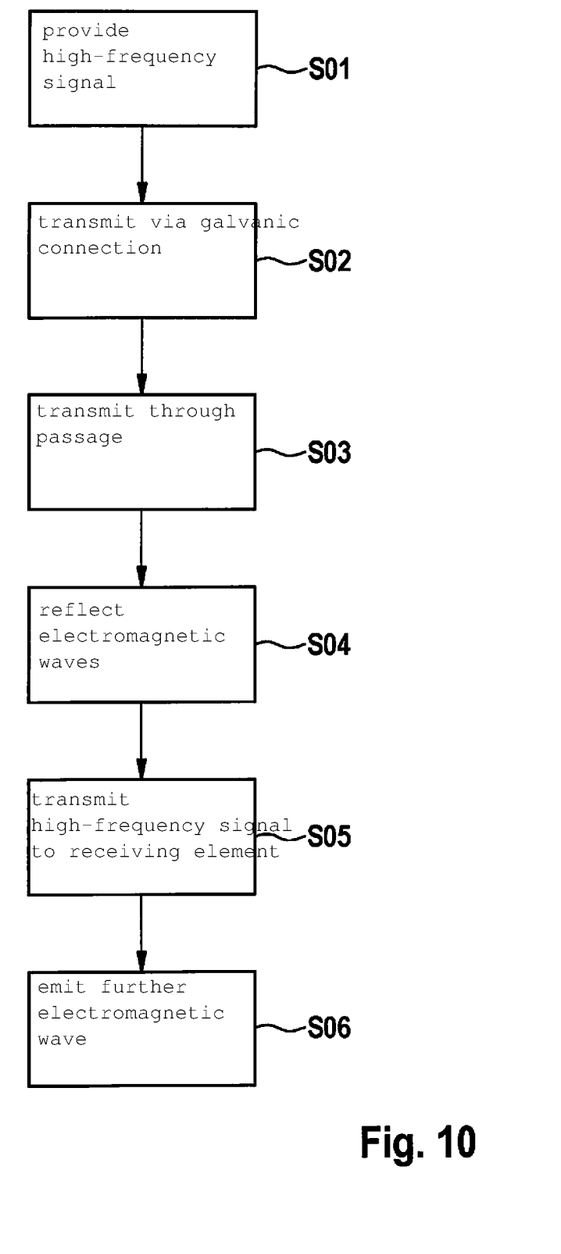
FIG. 10 shows a schematic flow chart to explain a method for transmitting a high-frequency signal according to a fourth specific embodiment of the present invention.

FIG. 10 shows a schematic flow chart to explain a method for transmitting a high-frequency signal according to a fourth specific embodiment of the present invention. The method according to the fourth specific embodiment is suitable for use with the device according to the first through third specific embodiments and may be specifically designed for this purpose. In particular, the method is adaptable according to all variants and refinements of the device according to the present invention described with respect to first through third specific embodiments. The numbering of method steps is used for the sake of clarity and is, in particular, not intended to imply a certain chronological sequence, unless indicated otherwise. In particular, multiple method steps may also be carried out simultaneously.

In a step S01, a high-frequency signal 9 is provided, for example with the aid of high-frequency signal generation unit 60 or by applying an externally generated high-frequency signal 9.

In a step S02, high-frequency signal 9 is transmitted at least in parts, in particular completely, via a galvanic connection 19, 33, 38-1, 19'-1 to a transmitting element 2; 32; 19'-3, which is formed at or on a first surface A1; 12-1 of an electrically non-conductive carrier 4; 4'; 12.

In a step S03, high-frequency signal 9 is transmitted through a passage 5; 50; 50', which is formed from first surface A1; 12-1 of carrier 4; 4'; 12 to a second surface A2; 12-2 of carrier 4; 4'; 12, as an electromagnetic wave to a receiving element 3; 42; 21'-3, which is formed at or on second surface A2; 12-2 of carrier 4; 4'; 12.

In an optional step S04, electromagnetic waves incident from the direction of passage 5; 50; 50' are reflected in the direction of passage 5; 50; 50' with the aid of a first and a second reflector element R1, R2; 36, 46; 38', 48', transmitting element 2; 32; 19'-3 being situated between carrier 4; 4'; 12 and first reflector element R1; 36, 38', and receiving element 3; 42; 21'-3 being situated between carrier 4; 4'; 12 and second reflector element R2; 46; 48'.

In a step S05, high-frequency signal 9 transmitted to receiving element 3; 42; 21'-3 is transmitted via a galvanic connection 48-1, 43, 21, 7, 8; 21'-1, 7, 8 to at least one antenna element 6 or to a feed point 7, at which the high-frequency signal is tappable, for example for exciting antenna unit 70 or further electrical lines.

In an optional step S06, a further electromagnetic wave is emitted by the at least one antenna element 6 of antenna unit 70.

Although the present invention has been described above based on preferred exemplary embodiments, it is not limited thereto, but is modifiable in a variety of ways. The present invention may in particular be changed or modified in multiple ways without departing from the core of the present invention.

For example, the first closure element according to the second specific embodiment, which includes the transmitting element, may also be combined with the second closure element according to the third specific embodiment, which is designed separately from the receiving element. Conversely, the second closure element according to the second specific embodiment, which includes the receiving element, may also be combined with the first closure element according to the third specific embodiment, which is designed separately from the transmitting element.

What is claimed is:

1. A device for transmitting a high-frequency signal, comprising:
an electrically non-conductive carrier through which a passage is formed from a first surface of the carrier to a second surface of the carrier, wherein the passage includes two open ends, each open end providing access to an outside of the device;
a transmitting element situated on or at the first surface of the carrier and to which the high-frequency signal may be applied;
a receiving element situated on or at the second surface of the carrier, the receiving element being galvanically isolated from the transmitting element wherein the applied high-frequency signal being transmittable as an electromagnetic wave to the receiving element through the passage through the carrier with the aid of the transmitting element;
a first closure element which is situated at the first surface of the carrier over the passage and which includes a first metallic layer facing the passage; and
a second closure element which is situated at the second surface of the carrier over the passage and which includes a second metallic layer facing the passage, wherein at least one of: (i) the transmitting element is part of the first metallic layer, and (ii) the receiving element is part of the second metallic layer.

2. A method for transmitting a high-frequency signal, comprising:
providing a high-frequency signal;
transmitting the high-frequency signal via a galvanic or electromagnetic connection to a transmitting element, which is formed at or on a first surface of an electrically non-conductive carrier; and
transmitting the high-frequency signal through a passage, which is formed from the first surface of the carrier to a second surface of the carrier, as an electromagnetic wave to a receiving element, which is formed at or on the second surface of the carrier, wherein the passage includes two open ends, each open end providing access to an outside of the device, wherein a first non-conductive layer, which seals the passage at the first surface, is formed at the first surface of the carrier, and a second non-conductive layer, which seals the passage at the second surface, is formed at the second surface of the carrier.

3. The method as recited in claim 2, further comprising:
reflecting electromagnetic waves incident from the direction of the passage in the direction of the passage with the aid of a first and a second reflector element, the transmitting element being situated between the carrier and the first reflector element, and the receiving element being situated between the carrier and the second reflector element.

4. The method as recited in claim 2, further comprising:
transmitting the high-frequency signal transmitted to the receiving element via a galvanic or electromagnetic connection to at least one antenna element; and
emitting an electromagnetic wave by the at least one antenna element, based on the high-frequency signal transmitted to the at least one antenna element.

5. The method as recited in claim 2, wherein the transmitting element and the receiving element are situated mirror-symmetrically to one another with respect to a plane of symmetry that is parallel to the first and the second surfaces of the carrier.

6. The method as recited in claim 2, wherein at least one of:
a geometric projection of the transmitting element completely covers the open end of the passage facing the transmitting element, and
a geometric projection of the receiving element completely covers the open end of the passage facing the receiving element.

7. A device for transmitting a high-frequency signal, comprising:
an electrically non-conductive carrier through which a passage is formed from a first surface of the carrier to a second surface of the carrier, wherein the passage includes two open ends, each open end providing access to an outside of the device;
a transmitting element situated on or at the first surface of the carrier and to which the high-frequency signal may be applied;
a receiving element situated on or at the second surface of the carrier, the receiving element being galvanically isolated from the transmitting element;
wherein the applied high-frequency signal being transmittable as an electromagnetic wave to the receiving element through the passage through the carrier with the aid of the transmitting element, and wherein a first non-conductive layer, which seals the passage at the first surface, is formed at the first surface of the carrier, and a second non-conductive layer, which seals the passage at the second surface, is formed at the second surface of the carrier.

8. The device as recited in claim 7, wherein the transmitting element and the receiving element are situated mirror-symmetrically to one another with respect to a plane of symmetry that is parallel to the first and the second surfaces of the carrier.

9. The device as recited in claim 7, wherein at least one of: (i) the transmitting element is situated at the first non-conductive layer, and (ii) the receiving element is situated at the second non-conductive layer.

10. The device as recited in claim 7, further comprising:
at least one antenna element which is situated at or on the second surface of the carrier and which is galvanically or electromagnetically connected to the receiving element for transmitting the high-frequency signal from the receiving element to the antenna element.

11. The device as recited in claim 7, further comprising:
a high-frequency signal generation unit for generating the high-frequency signal, which is situated at or on the first surface of the carrier and which is galvanically or electromagnetically connected to the transmitting element for transmitting the high-frequency signal from the high-frequency signal generation unit to the transmitting element.

12. The device as recited in claim 7, wherein at least one of:
a geometric projection of the transmitting element completely covers the open end of the passage facing the transmitting element, and
a geometric projection of the receiving element completely covers the open end of the passage facing the receiving element.

13. The device as recited in claim 7, further comprising:
a first closure element which is situated at the first surface of the carrier over the passage and which includes a first metallic layer facing the passage; and
a second closure element which is situated at the second surface of the carrier over the passage and which includes a second metallic layer facing the passage.

14. The device as recited in claim 7, wherein at least one of: (i) the transmitting element is situated between the carrier and a first reflector element, which reflects electromagnetic waves incident from a direction of the passage in a direction of the passage, and (ii) the receiving element is situated between the carrier and a second reflector element, which reflects electromagnetic waves incident from the direction of the passage in the direction of the passage.

15. The device as recited in claim 14, further comprising:
a first closure element; and
a second closure element, wherein at least one of: (i) the first reflector element is a third metallic layer provided on a surface of the first closure element facing away from the carrier, and (ii) the second reflector element is a fourth metallic layer provided on a surface of the second closure element facing away from the carrier.

* * * * *